United States Patent
Jung et al.

(10) Patent No.: US 10,879,914 B1
(45) Date of Patent: Dec. 29, 2020

(54) PHASE-LOCKED LOOP (PLL) CIRCUIT AND CLOCK GENERATOR INCLUDING SUB-SAMPLING CIRCUIT

(71) Applicant: SAMSUNG ELECTRONICS CO., LTD., Suwon-si (KR)

(72) Inventors: Jaehong Jung, Bucheon-si (KR); Sangdon Jung, Yongin-si (KR); Seunghyun Oh, Seoul (KR); Kyungmin Lee, Yongin-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/842,281

(22) Filed: Apr. 7, 2020

(30) Foreign Application Priority Data

Jul. 18, 2019 (KR) .................. 10-2019-0087095

(51) Int. Cl.
*H03K 7/06* (2006.01)
*H03L 7/107* (2006.01)
*H03L 7/099* (2006.01)
*H03L 7/089* (2006.01)

(52) U.S. Cl.
CPC ............ *H03L 7/107* (2013.01); *H03L 7/0891* (2013.01); *H03L 7/099* (2013.01)

(58) Field of Classification Search
CPC ........ H03L 7/107; H03L 7/0891; H03L 7/099
USPC .......................................... 327/157
See application file for complete search history.

(56) References Cited

U.S. PATENT DOCUMENTS

| | | | |
|---|---|---|---|
| 6,570,947 B1 | 5/2003 | Zipper et al. | |
| 6,909,329 B2 | 6/2005 | Jasa et al. | |
| 7,135,900 B2 | 11/2006 | Sohn | |
| 7,138,838 B2 | 11/2006 | Shibahara et al. | |
| 7,312,663 B2 | 12/2007 | Abel | |
| 8,217,696 B2 | 7/2012 | August et al. | |
| 9,608,644 B1 * | 3/2017 | Raj | H03L 7/113 |
| 9,742,380 B1 * | 8/2017 | Raj | H03K 3/013 |
| 9,991,897 B1 * | 6/2018 | Park | H03L 7/091 |
| 10,027,333 B2 | 7/2018 | Lahiri et al. | |
| 10,411,716 B2 * | 9/2019 | Chen | H03L 7/06 |
| 10,615,807 B2 * | 4/2020 | Jakobsson | H03L 7/089 |
| 2013/0156076 A1 * | 6/2013 | Kinget | H04L 27/18 375/219 |
| 2017/0324416 A1 * | 11/2017 | Jakobsson | H03L 7/0898 |
| 2018/0254774 A1 * | 9/2018 | Thijssen | H03L 7/0991 |
| 2018/0302069 A1 * | 10/2018 | Loke | H03K 5/24 |

FOREIGN PATENT DOCUMENTS

KR   10-1780630 B1   10/2017

* cited by examiner

*Primary Examiner* — Ryan Jager
(74) *Attorney, Agent, or Firm* — Sughrue Mion, PLLC

(57) ABSTRACT

A phase-locked loop (PLL) circuit includes a voltage-controlled oscillator configured to generate an output clock, and a sub-sampling PLL circuit configured to receive, from the voltage-controlled oscillator, the generated output clock as feedback, and perform a phase-locking operation on the received output clock. The sub-sampling PLL circuit includes a buffer configured to buffer the received output clock, and the sub-sampling PLL circuit is further configured to adaptively adjust an internal signal to maintain a loop bandwidth of the sub-sampling PLL circuit, based on a change of a characteristic of the buffer according to at least one of process, voltage, and temperature (PVT) change.

19 Claims, 14 Drawing Sheets

PHASE-LOCKED LOOP (PLL) CIRCUIT AND CLOCK GENERATOR INCLUDING SUB-SAMPLING CIRCUIT

CROSS-REFERENCE TO THE RELATED APPLICATION

This application is based on and claims priority under 35 U.S.C. § 119 to Korean Patent Application No. 10-2019-0087095, filed on Jul. 18, 2019, in the Korean Intellectual Property Office, the disclosure of which is incorporated by reference herein in its entirety.

BACKGROUND

The disclosure relates to a phase-locked loop (PLL) circuit and a clock generator including a sub-sampling PLL circuit for locking a phase of a clock.

A PLL circuit or a clock generator including a PLL circuit may generate a phase-locked clock signal. For example, a clock signal may be used to transmit data through a transmitter or to recover data through a receiver. In this case, the PLL circuit may include a ring-PLL circuit, an inductor-capacitor (LC)-PLL circuit, etc.

A technique for locking a phase of a clock through sub-sampling for improving noise characteristics has recently been applied to PLL circuits. Here, the PLL circuits include a buffer circuit to prevent an instantaneous phase distortion of an oscillator (e.g., a voltage-controlled oscillator) during a sub-sampling operation. Because buffer circuits usually include complementary metal-oxide semiconductor (CMOS) transistors, the buffer circuits are vulnerable to process, voltage, and temperature (PVT) changes, and thus a loop bandwidth of the PLL circuit may be changed by the buffer circuit according to the PVT changes.

SUMMARY

According to embodiments, a phase-locked loop (PLL) circuit includes a voltage-controlled oscillator configured to generate an output clock, and a sub-sampling PLL circuit configured to receive, from the voltage-controlled oscillator, the generated output clock as feedback, and perform a phase-locking operation on the received output clock. The sub-sampling PLL circuit includes a buffer configured to buffer the received output clock, and the sub-sampling PLL circuit is further configured to adaptively adjust an internal signal to maintain a loop bandwidth of the sub-sampling PLL circuit, based on a change of a characteristic of the buffer according to at least one of process, voltage, and temperature (PVT) change.

According to embodiments, a phase-locked loop (PLL) circuit includes a voltage-controlled oscillator configured to generate an output clock, and a sub-sampling PLL circuit configured to perform a phase-locking operation on the generated output clock. The sub-sampling PLL circuit includes a buffer configured to buffer the generated output clock, and a replica buffer that is used to detect a change of a characteristic of the buffer according to at least one of process, voltage, and temperature (PVT) change. The sub-sampling PLL circuit is further configured to generate a comparative voltage signal reflecting a characteristic of the replica buffer, and adaptively adjust a pulse width of an internal signal to maintain a loop bandwidth of the sub-sampling PLL circuit, based on the generated comparative voltage signal.

According to embodiments, a clock generator includes a voltage-controlled oscillator configured to generate an output clock, an assistant phase-locked loop (PLL) circuit configured to perform a primary phase-locking operation on the generated output clock, and a sub-sampling PLL circuit configured to perform a secondary phase-locking operation on the output clock after the primary phase-locking operation is performed. The PLL circuit further includes a buffer configured to buffer the generated output clock, a replica buffer configured to have a characteristic identical to a characteristic of the buffer, and buffer a reference clock, a characteristic detector configured to detect a change of the characteristic of the buffer according to at least one of process, voltage, and temperature (PVT) change, based on the buffered reference clock, and a pulse generator configured to generate a pulse signal with a pulse width that is adjusted based on the detected change of the characteristic of the buffer.

DETAILED DESCRIPTION OF THE EMBODIMENTS

Embodiments provide a phase-locked loop (PLL) circuit and a clock generator capable of adjusting a loop bandwidth of the PLL circuit or the clock generator constant or generating a reliable clock by tracking a loop bandwidth that varies according to changes of a noise characteristic.

Figure 1:
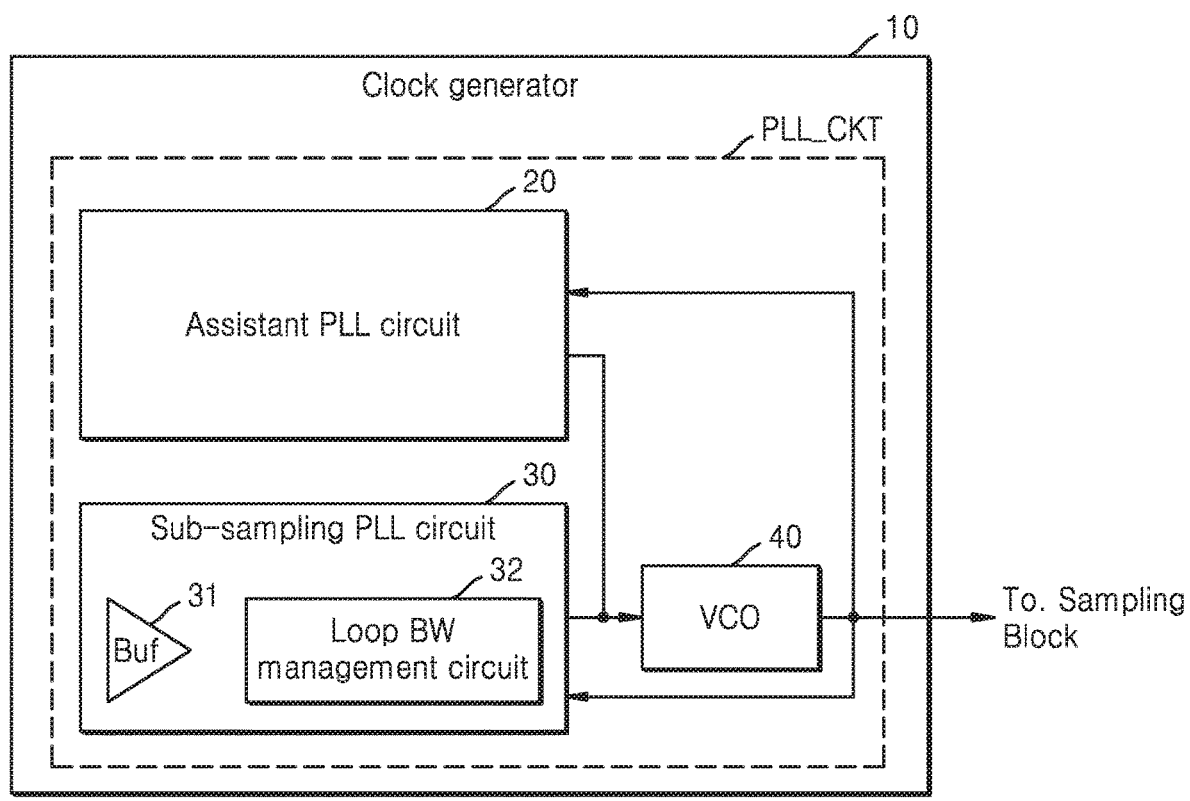
FIG. 1 is a block diagram showing a clock generator according to embodiments.

FIG. 1 is a block diagram showing a clock generator according to embodiments.

Referring to FIG. 1, a clock generator 10 may include a phase-locked loop (PLL) circuit PLL_CKT, and the PLL circuit PLL_CKT may include an assistant PLL circuit 20, a sub-sampling PLL circuit 30, and a voltage-controlled oscillator (VCO) 40. Hereinafter, the VCO 40 may be implemented in various configurations like a ring oscillator or an inductor-capacitor (LC) oscillator.

The assistant PLL circuit 20 may receive an output clock (or an oscillation signal) as a feedback from the VCO 40 and perform a primary phase-locking operation Hereinafter, the primary phase-locking operation may refer to a phase-locking operation for locating a phase difference between the phase of an output clock of the sub-sampling PLL circuit 30 and the phase of a reference clock within a locking range for a secondary phase-locking operation of the output clock. In other words, the primary phase-locking operation is preceded to perform the secondary phase-locking operation of the sub-sampling PLL circuit 30 and may also be referred to as an assistant phase-locking operation. Also, a PLL performed by the assistant PLL circuit 20 may be defined as an assistant PLL. Detailed configuration and operation of the assistant PLL circuit 20 will be described with reference to FIG. 5.

The sub-sampling PLL circuit 30 may include a buffer circuit 31 and a loop bandwidth (BW) managing circuit 32. The sub-sampling PLL circuit 30 may receive the output clock (a primary phase-locked output clock from the assistant PLL circuit 20) from the VCO 40 as feedback and perform sub-sampling by using the output clock. In this case, the buffer circuit 31 may have a configuration for receiving an output clock and preventing phase distortion of the VCO 40 that may occur during a sub-sampling operation. A PLL performed by the sub-sampling PLL circuit 30 may be defined as a sub-sampling PLL.

The loop bandwidth managing circuit 32 adaptively adjusts an internal signal for a sub-sampling operation based on variable characteristic of the buffer circuit 31 according to process, voltage, and temperature (PVT) changes, thereby maintaining the loop bandwidth of the sub-sampling PLL circuit 30 (or a PLL circuit PLL_CKT). The loop bandwidth is determined according to noise characteristic of the sub-sampling PLL circuit 30 (or the PLL circuit PLL_CKT). Detailed descriptions thereof will be given below with reference to FIG. 4.

In embodiments, the characteristic of the buffer circuit 31 may include a slew rate of an output clock passing through the buffer circuit 31. Hereinafter, the slew rate of an output clock passing through the buffer circuit 31 may be used interchangeably with the same definition as the slew rate of the buffer circuit 31. In this case, the loop bandwidth managing circuit 32 may detect the slew rate of the buffer circuit 31 and adaptively adjust an internal signal to maintain a loop bandwidth based on a detection result. In embodiments, an internal signal is a pulse-shaped signal for adjusting the loop gain and the loop bandwidth of the sub-sampling PLL circuit 30 and may be applied to a transconductance circuit of the sub-sampling PLL circuit 30. In embodiments, the transconductance circuit may perform an operation for converting sampled voltage information into current information in response to an internal signal. In detail, the transconductance circuit may be configured to operate only at a level of an internal signal, and the configuration of the transconductance circuit of the sub-sampling PLL circuit 30 will be described below in detail with reference to FIG. 5B.

In embodiments, the charge pump may perform a charge pumping operation in response to an internal signal. In detail, the charge pump may be configured to perform a charge pumping operation only at a level of an internal signal, and the configuration of the charge pump of the sub-sampling PLL circuit 30 will be described below in detail with reference to FIG. 5B.

Although FIG. 1 shows the sub-sampling PLL circuit 30 including the buffer circuit 31 as a component sensitive to PVT changes, it is an example, and the embodiments are not limited thereto. The sub-sampling PLL circuit 30 may further include components sensitive to PVT changes, wherein the loop bandwidth managing circuit 32 may adaptively adjust an internal signal in consideration of any one or any combination of the characteristic of the other components according to PVT changes. Furthermore, the loop bandwidth managing circuit 32 may adaptively adjust an internal signal in consideration of changes of characteristic of components other than the buffer circuit 31 according to PVT changes.

The optimal loop bandwidth may vary according to the noise characteristic of the PLL circuit PLL_CKT, which vary according to various environments. Therefore, the loop bandwidth managing circuit 32 may track the varying optimal loop bandwidth by adjusting an internal signal. In detail, the loop bandwidth managing circuit 32 may monitor (or detect) whether the optimal loop bandwidth is changed according to a change in the noise characteristic of the PLL circuit PLL_CKT, and the loop bandwidth managing circuit 32 may adaptively adjust an internal signal to track the changed optimal loop bandwidth. Furthermore, the loop bandwidth managing circuit 32 may adaptively adjust an internal signal, such that a tracked loop bandwidth may be maintained even with a PVT change.

A phase-locked output clock, which is phase-locked through a phase-locking operation, may be provided to a sampling block outside the clock generator 10. The clock generator 10 may generate an output clock with high reliability by maintaining the optimal loop bandwidth even with a PVT change. Furthermore, the clock generator 10 may perform various processing operations by using an output clock with high reliability, thereby improving the overall performance of an electronic device including the clock generator 10.

Figure 2:
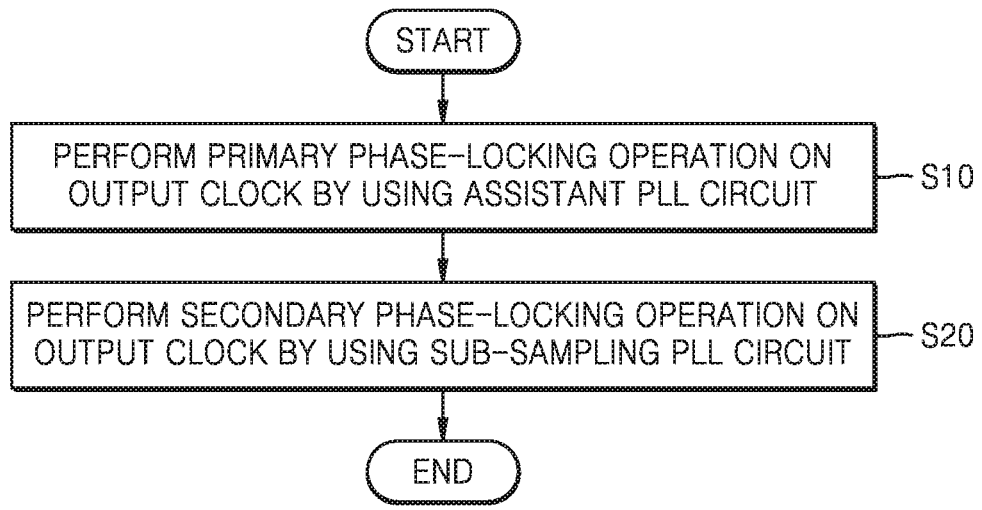
FIG. 2 is a flowchart for describing a phase-locking operation according to embodiments.

FIG. 2 is a flowchart for describing a phase-locking operation according to embodiments. Hereinafter, descriptions of FIG. 2 will be given with reference to FIG. 1.

Referring to FIGS. 1 and 2, a primary phase-locking operation may be performed on an output clock of the VCO 40 by using the assistant PLL circuit 20 (operation S10). The assistant PLL circuit 20 may perform a PLL to lock the phase of the output clock of the VCO 40 and may perform a primary phase-locking operation, such that a phase difference between the output clock and a reference clock are located within a locking range. In other words, the assistant PLL circuit 20 may be deactivated when the phase difference between the output clock and the reference clock are located within a dead zone.

Thereafter, a secondary phase-locking operation may be performed on the output clock of the VCO 40 by using the sub-sampling PLL circuit 30 (operation S20). In detail, the sub-sampling PLL circuit 30 may perform a PLL to lock the phase of the output clock by performing a sub-sampling operation using the output clock and perform a secondary phase, such that the output clock corresponds to the phase of the reference clock. The sub-sampling operation of the sub-sampling PLL circuit 30 may minimize the change of the loop bandwidth according to PVT changes, and an example operation thereof will be described below in detail with reference to FIG. 3.

Figure 3:
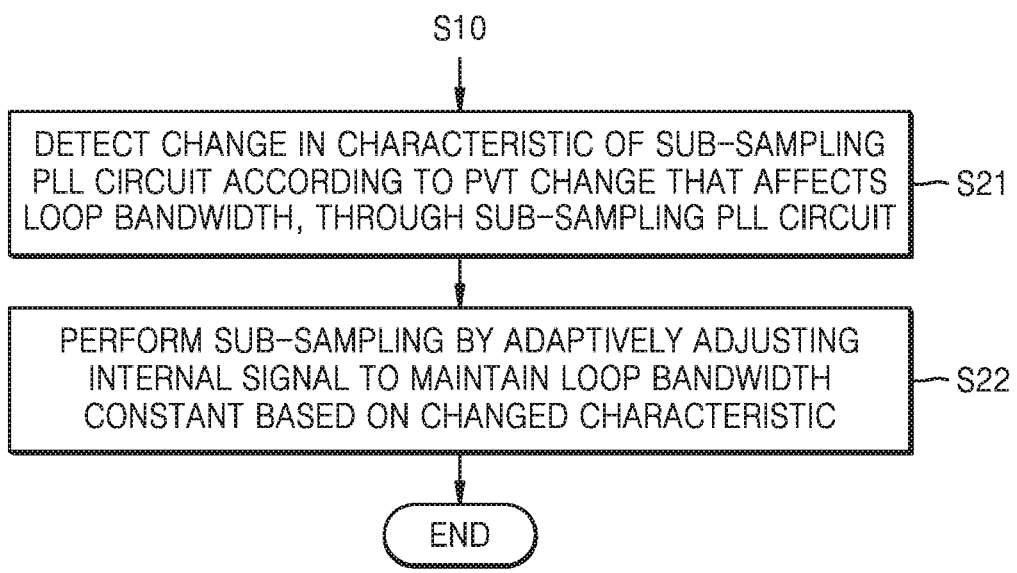
FIG. 3 is a flowchart for describing operation S20 of FIG. 2 in detail.

FIG. 3 is a flowchart for describing operation S20 of FIG. 2 in detail. Hereinafter, descriptions of FIG. 3 will be given with reference to FIG. 1.

Referring to FIGS. 1 and 3, after operation S10 of FIG. 2, the sub-sampling PLL circuit 30 may detect a change in characteristic of the sub-sampling PLL circuit 30 according to a PVT change that affects the loop bandwidth of the sub-sampling PLL circuit 30 or the PLL circuit PLL_CKT (operation S21). In detail, the sub-sampling PLL circuit 30 may detect that the characteristic of the buffer circuit 31 in the sub-sampling PLL circuit 30 are changed according to a PVT change. In embodiments, the sub-sampling PLL circuit 30 may further include a replica buffer circuit having characteristic same as or similar to those of the buffer circuit 31 and detect a change in characteristic of the buffer circuit 31 according to PVT changes indirectly through the replica buffer circuit. In embodiments, a configuration capable of directly detecting a change of the characteristic of the buffer circuit 31 may be applied to the sub-sampling PLL circuit 30.

Thereafter, the sub-sampling PLL circuit 30 may perform a sub-sampling by adaptively adjusting an internal signal to maintain the loop bandwidth constant based on a changed characteristic of the buffer circuit 31 (operation S22). In detail, the sub-sampling PLL circuit 30 may an internal signal to suppress the increase of the loop bandwidth when the characteristic of the buffer circuit 31 is changed to increase the loop bandwidth by a PVT change. When the characteristic of the buffer circuit 31 is changed to decrease the loop bandwidth, the internal signal may be adjusted to suppress the decrease of the loop bandwidth. As described above, an internal signal may be applied to the charge pump of the sub-sampling PLL circuit 30 as a signal in the form of pulses for adjusting the loop gain of the sub-sampling PLL circuit 30. However, it is an example, and the embodiments are not limited thereto. Internal signals may be defined as various signals capable of adjusting the loop gain according to the configuration of the sub-sampling PLL circuit 30.

Figure 4:
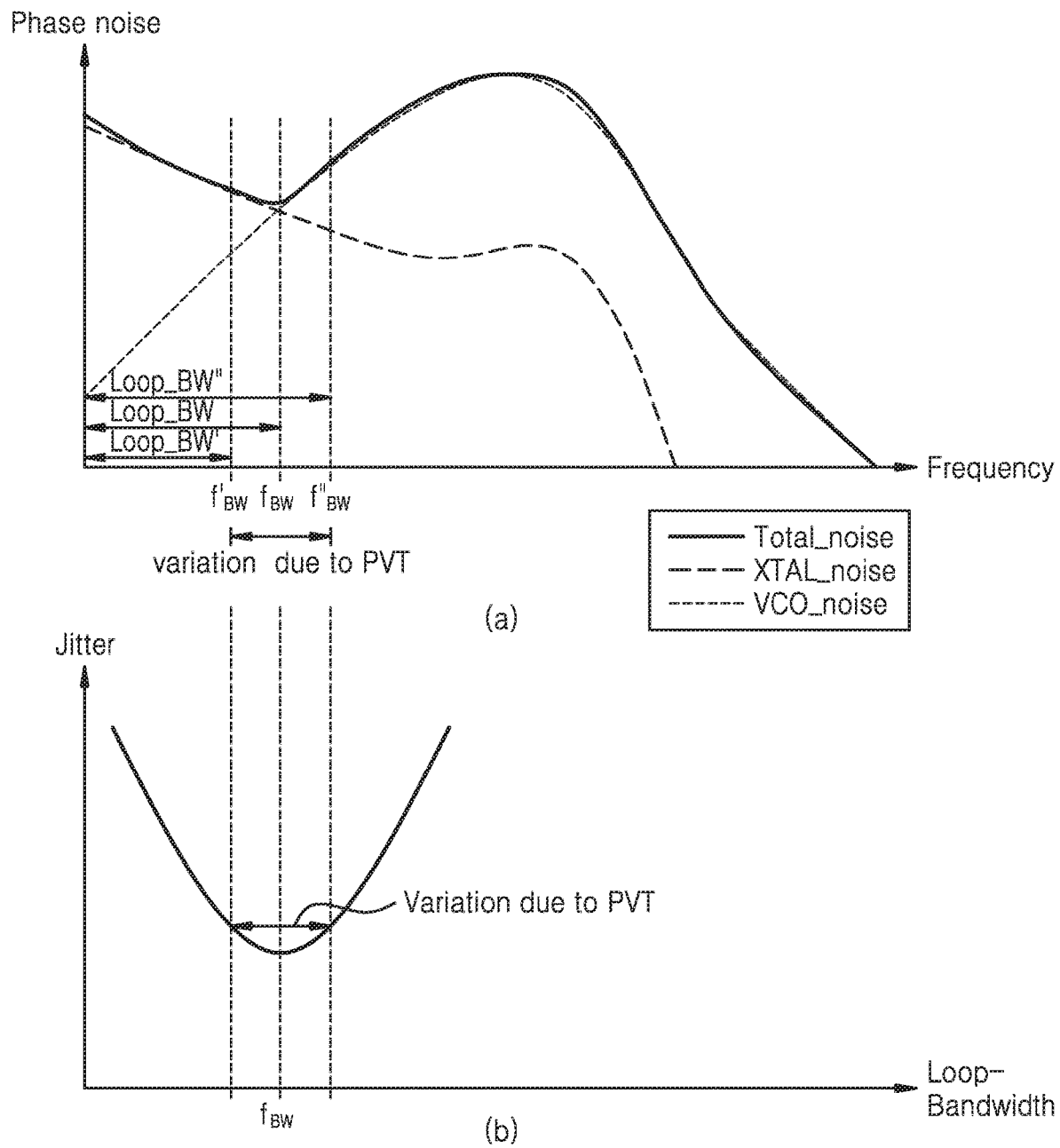
FIG. 4 shows graphs for describing changes in loop bandwidth according to PVT changes.

FIG. 4 shows graphs for describing changes in loop bandwidth according to PVT changes.

Referring to graph (a) of FIG. 4, the loop bandwidth of a sub-sampling PLL circuit (or a PLL circuit) may be determined based on noise XTAL_noise of a crystal included in the sub-sampling PLL circuit (or the PLL circuit) and noise VCO_noise of a VCO. The crystal may be a source of a reference clock used to lock the phase of an output clock of the VCO. The noise XTAL_noise of the crystal and the noise VCO_noise of the VCO may exhibit different characteristic changes according to frequencies. For example, an optimal loop bandwidth Loop_BW may be determined based on a frequency $f_{BW}$ at which a sum Total_noise of the noise XTAL_noise of the crystal and the noise VCO_noise of the VCO may be minimized.

However, as described above, the characteristic of the sub-sampling PLL circuit may be changed according to PVT changes, and thus the optimal loop bandwidth Loop_BW may be changed to another loop bandwidth Loop_BW' or Loop_BW''. Because noise corresponding to a frequency $f_{BW'}$ or $f_{BW''}$ according to a change of the loop bandwidth is greater than noise corresponding to the frequency $f_{BW}$, a PVT change may deteriorate the performance of the sub-sampling PLL circuit or the PLL circuit In other words, referring to a graph (b) of FIG. 4, when a phase-locking operation of the sub-sampling PLL circuit is performed, jitter is minimized at a frequency $f_{BW}$ (or a loop bandwidth). However, according to a PVT change, the loop bandwidth may vary, and thus the jitter may be increased.

The sub-sampling PLL circuit may adaptively adjust the loop gain, which is a parameter for determining the loop bandwidth, to maintain the optimal loop bandwidth Loop_BW for minimizing jitter even with a PVT change. In detail, the sub-sampling PLL circuit may maintain the optimal loop bandwidth Loop_BW by adjusting the pulse width of an internal signal related to the loop gain in consideration of changes in characteristic according to a PVT change.

Figure 5A:
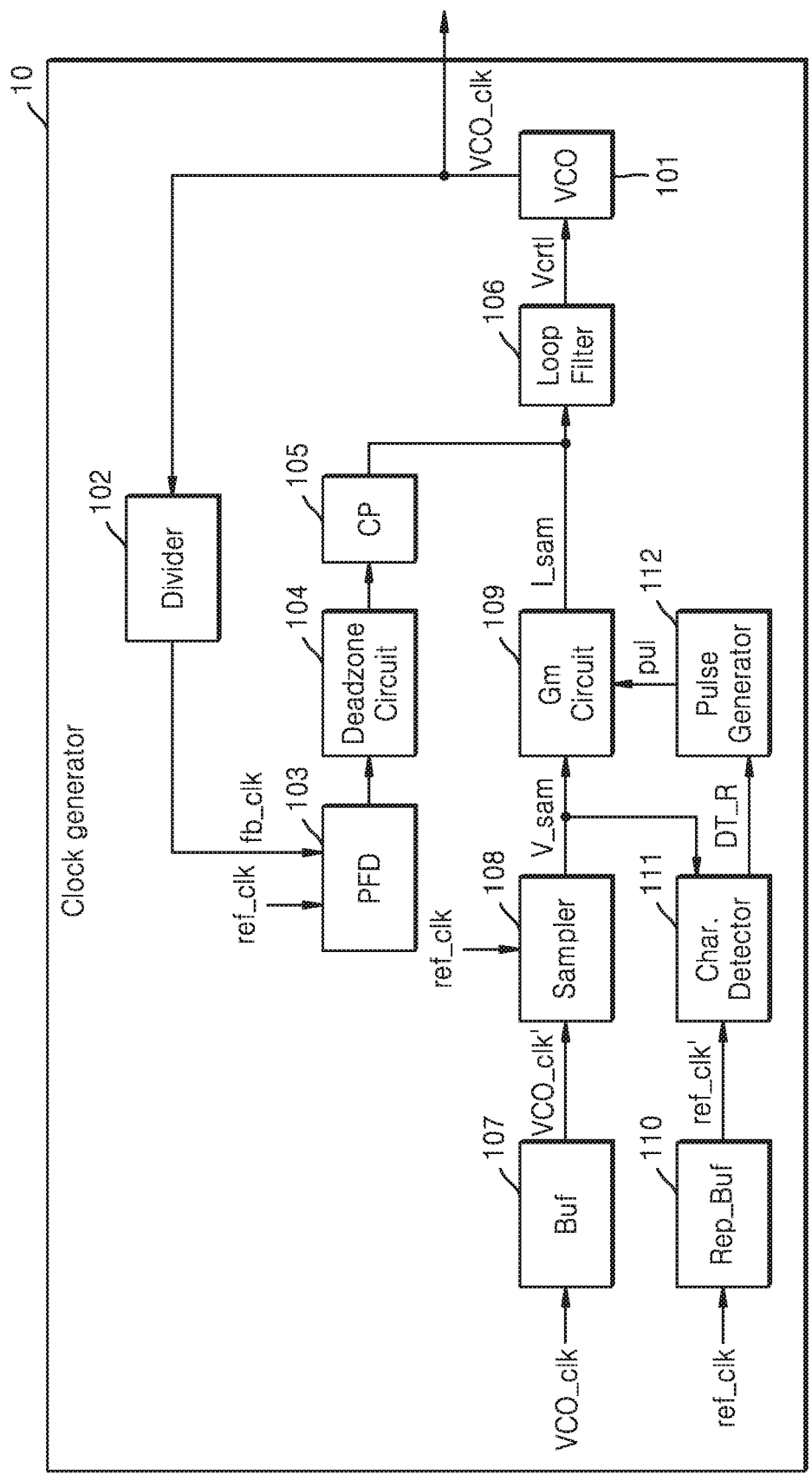
FIG. 5A is a block diagram showing another example of a clock generator according to embodiments.
Figure 5B:
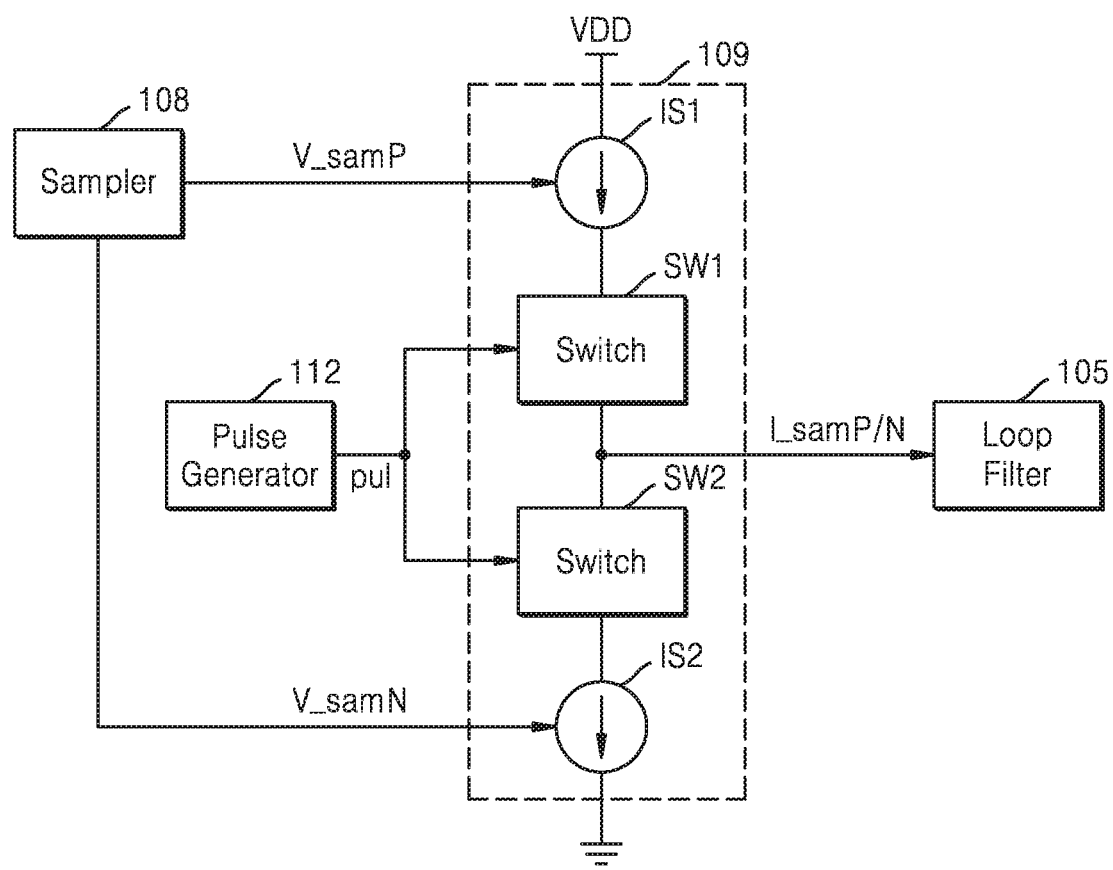
FIG. 5B is a circuit diagram showing a transconductance circuit of FIG. 5A.

FIG. 5A is a block diagram showing another example of a clock generator according to embodiments, and FIG. 5B is a circuit diagram showing a transconductance circuit of FIG. 5A. In FIG. 5A, signals are shown in simplified for convenience of explanation. However, in embodiments, a voltage-controlled oscillator (VCO) 101 may output differential signals having opposite phases through two lines, and signal lines may be implemented, such that the clock generator 10 may perform a phase-locking operation using the differential signals.

Referring to FIG. 5A, the clock generator 10 may include the VCO 101, a divider 102, a phase-frequency detector (PFD) 103, a dead zone circuit 104, a charge pump (CP) 105, a loop filter 106, a buffer circuit 107, a sampler 108, a transconductance (Gm) circuit 109, a replica buffer circuit 110, a characteristic detector 111, and a pulse generator 112.

In embodiments, the divider 102, the phase-frequency detector 103, the dead zone circuit 104, and the charge pump 105 may constitute the assistant PLL circuit 20 of FIG. 1, and the buffer circuit 107, the sampler 108, the transconductance circuit 109, the replica buffer circuit 110, the characteristic detector 111, and the pulse generator 112 may constitute the sub-sampling PLL circuit 30 of FIG. 1. The replica buffer circuit 110, the characteristic detector 111, and the pulse generator 112 may constitute the loop bandwidth managing circuit 32 of FIG. 1.

First, the VCO 101 may provide an output clock VCO_clk to the divider 102, and the divider 102 may generate a feedback clock fb_clk from the output clock VCO_clk and provide the feedback clock fb_clk to the phase-frequency detector 103. According to embodiments, the divider 102 may be implemented as an integer divider. The phase-frequency detector 103 may receive the reference clock ref_clk and the feedback clock fb_clk, detect a phase difference between the reference clock ref_clk and the feedback clock fb_clk, and provide a detection result to the dead zone circuit 104. The dead zone circuit 104 may determine whether the phase difference between the reference clock ref_clk and the feedback clock fb_clk exists within a pre-set dead zone. When the phase difference exists within the dead zone, the dead zone circuit 104 may complete a phase-locking operation using an assistant PLL and deactivate the assistant PLL. When the phase difference exists outside the dead zone, the dead zone circuit 104 may provide a detection result received from the phase-frequency detector 103 to the charge pump 105. The charge pump 105 may generate a current signal for generating a voltage control signal Vctrl based on the detection result and provide the current signal to the loop filter 106. The loop filter 106 may generate a voltage control signal Vctrl by filtering the current signal and provide the voltage control signal Vctrl to the VCO 101.

An assistant PLL using the divider 102, the phase-frequency detector 103, the dead zone circuit 104, and the charge pump 105 may be repeatedly performed until the phase difference between the reference clock ref_clk and feedback clock fb_clk exists within the dead zone. As described above, a phase-locking operation using the assistant PLL may be referred to as a primary phase-locking operation. Thereafter, the clock generator 10 may perform only a sub-sampling PLL for fine phase-locking of the output clock VCO_clk based on the reference clock ref_clk.

The replica buffer circuit 110 according to embodiments may be implemented in consideration of the configuration and the layout of the buffer circuit 107 to have characteristic similar to those of the buffer circuit 107. The sub-sampling PLL may indirectly detect a change of the characteristic of the buffer circuit 107 according to a PVT change by using the replica buffer circuit 110, maintain the loop bandwidth of the sub-sampling PLL constant based on a detection result, and lock the phase of the output clock VCO_clk.

In detail, the VCO 101 may provide the output clock VCO_clk, which is primary phase-locked by the assistant PLL, to the buffer circuit 107, and the buffer circuit 107 may buffer the output clock VCO_clk and provide a buffered output clock VCO_clk' to the sampler 108. The sampler 108 may receive the buffered output clock VCO_clk' and the reference clock ref_clk and generate a sampling voltage signal V_sam by sampling the buffered output clock VCO_clk' based on the reference clock ref_clk. The sampler 108 may be referred to as a sub-sampling phase detector. The transconductance circuit 109 may receive the sampling voltage signal V_sam, convert the sampling voltage signal V_sam into a sampling current signal I_sam, and provide the sampling current signal I_sam to the loop filter 106. The loop filter 106 may generate a voltage control signal Vctrl by using the sampling current signal I_sam.

The replica buffer circuit 110 may receive the reference clock ref_clk, buffer the reference clock ref_clk, and provide a buffered reference clock ref_clk' to the characteristic detector 111. The characteristic detector 111 may detect the characteristic of the replica buffer circuit 110 based on the buffered reference clock ref_clk'. In embodiments, the characteristic detector 111 may detect a change in the slew rate of the buffered reference clock ref_clk' according to a PVT change and detect the characteristic of the replica buffer circuit 110 based on a detected change in the slew rate of the buffered reference clock ref_clk'. The characteristic detector 111 may provide a detection result DT_R to the pulse generator 112. The pulse generator 112 may generate a pulse signal (or an internal signal) pul for the operation of the transconductance circuit 109 based on the detection result DT_R and the sampling voltage signal V_sam and provide the pulse signal pul to the transconductance circuit 109. The pulse signal pul may be a signal for adjusting the loop gain of the sub-sampling PLL, and the pulse generator 112 may adjust the pulse width of the pulse signal pul to prevent the loop bandwidth from being changed even with a change in the characteristic of the replica buffer circuit 110 according to a PVT change. For detailed descriptions thereof, Equation 1 regarding the loop bandwidth is provided below.

[Equation 1]

$$\text{Loop Bandwidth} = C * SR_{VCO\_clk} * \left(\frac{T_{pul}}{T_{ref}}\right) * Gm * Z_{LF}(s) * K_{VCO}$$

The loop bandwidth of the sub-sampling PLL may be defined with any constant C, a slew rate $SR_{VCO\_clk}$ of the buffer circuit 107, a pulse width $T_{pul}$ of the pulse signal pul of the pulse generator 112, a pulse period $T_{ref}$, a transconductance value Gm of the transconductance circuit 109, a transfer function $Z_{LF}(S)$ of the loop filter 106, and a gain $K_{VCO}$ of a VCO. According to a PVT change, the slew rate $SR_{VCO\_clk}$ of the buffer circuit 107 may be changed, and accordingly, the loop bandwidth may be changed. To prevent a change in the loop bandwidth, the characteristic detector 111 may detect a change in the slew rate $SR_{VCO\_clk}$ of the buffer circuit 107 according to a PVT change by using the replica buffer circuit 110. A characteristic detecting method and a configuration of the characteristic detector 111 according to embodiments will be described below with reference to FIG. 6A. The pulse generator 112 may adaptively adjust the pulse width $T_{pul}$ of the pulse signal pul according to a change in the slew rate $SR_{VCO\_clk}$ of the buffer circuit 107, thereby maintaining the loop bandwidth constant. For example, the pulse generator 112 may reduce the pulse width $T_{pul}$ when the slew rate $SR_{VCO\_clk}$ of the buffer circuit 107 increases according to a PVT change and increase the pulse width $T_{pul}$ when the slew rate $SR_{VCO\_clk}$ of the buffer circuit 107 decreases according to a PVT change. The pulse width $T_{pul}$ relative to the pulse period $T_{ref}$ is related to the loop gain. In other words, the pulse generator 112 may change the pulse width $T_{pul}$ to maintain the loop bandwidth constant even with a PVT change.

Further referring to FIG. 5B to describe the configuration of the transconductance circuit 109, the transconductance circuit 109 may include first and second current sources IS1 and IS2 and first and second switch circuits SW1 and SW2. A first current source IS1 may generate a positive sampling current signal I_samP by converting a positive sampling voltage signal V_samP received from the sampler 108. The second current source IS2 may generate a negative sampling current signal I_samN by converting a negative sampling voltage signal V_samN received from the sampler 108. The first and second switch circuits SW1 and SW2 may receive the pulse signal pul from the pulse generator 112 and perform a switching operation in response to the pulse signal pul.

Although FIG. 5A shows the charge pump 105 and the transconductance circuit 109 as separate components, it is an example, and the embodiments are not limited thereto. The clock generator 10 may further include a multiplexer, and, through the multiplexer, the transconductance circuit 109 may be used in an assistant PLL instead of the charge pump 105.

The transconductance circuit 109 may receive the pulse signal pul and the sampling voltage signal V_sam and perform a charge pumping operation in response to the pulse signal pul. In embodiments, the transconductance circuit 109 may perform a charge pumping operation when the pulse signal pul is at a high level.

A sub-sampling PLL using the buffer circuit 107, the sampler 108, the transconductance circuit 109, the replica buffer circuit 110, the characteristic detector 111, and the pulse generator 112 may be repeated until the phase of the reference clock ref_clk is the same as or similar to the phase of the output clock VCO_clk. As described above, a phase-locking operation using the sub-sampling PLL may be referred to as a secondary phase-locking operation.

The VCO 101 may output the output clock VCO_clk, which is phase-locked through a sub-sampling PLL, to the outside.

Although the description of FIG. 5A focuses on the configuration of the clock generator 10 to which a method for indirectly detecting the characteristic of the buffer circuit 107 through the replica buffer circuit 110 is applied, it is an example, and the embodiments are not limited thereto. The clock generator 10 may be implemented by applying a method for directly detecting the characteristic of the buffer circuit 107.

Figure 6A:
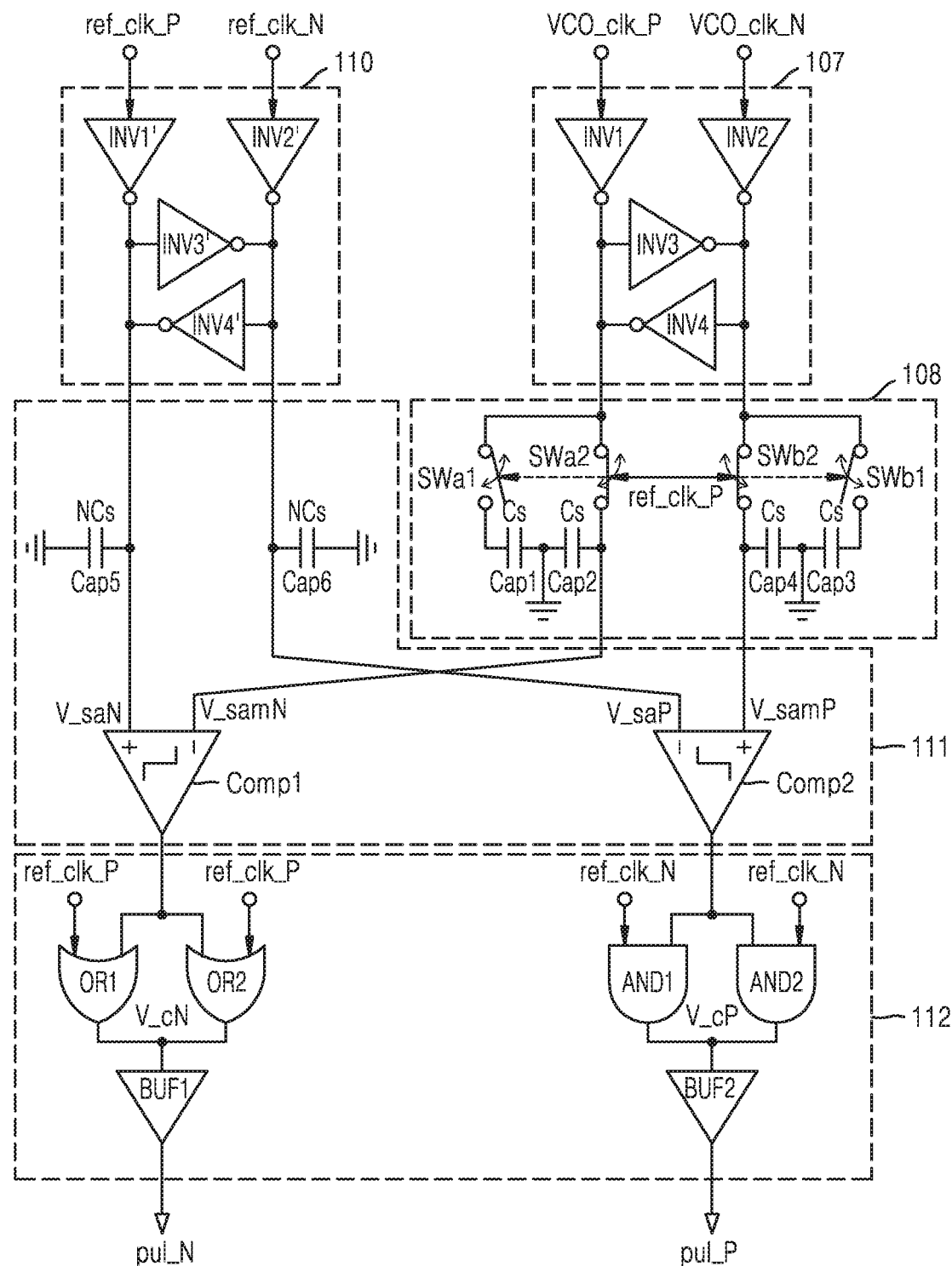
FIGS. 6A and 6B are circuit diagrams for describing in detail components included in a sub-sampling PLL circuit according to embodiments.
Figure 6B:
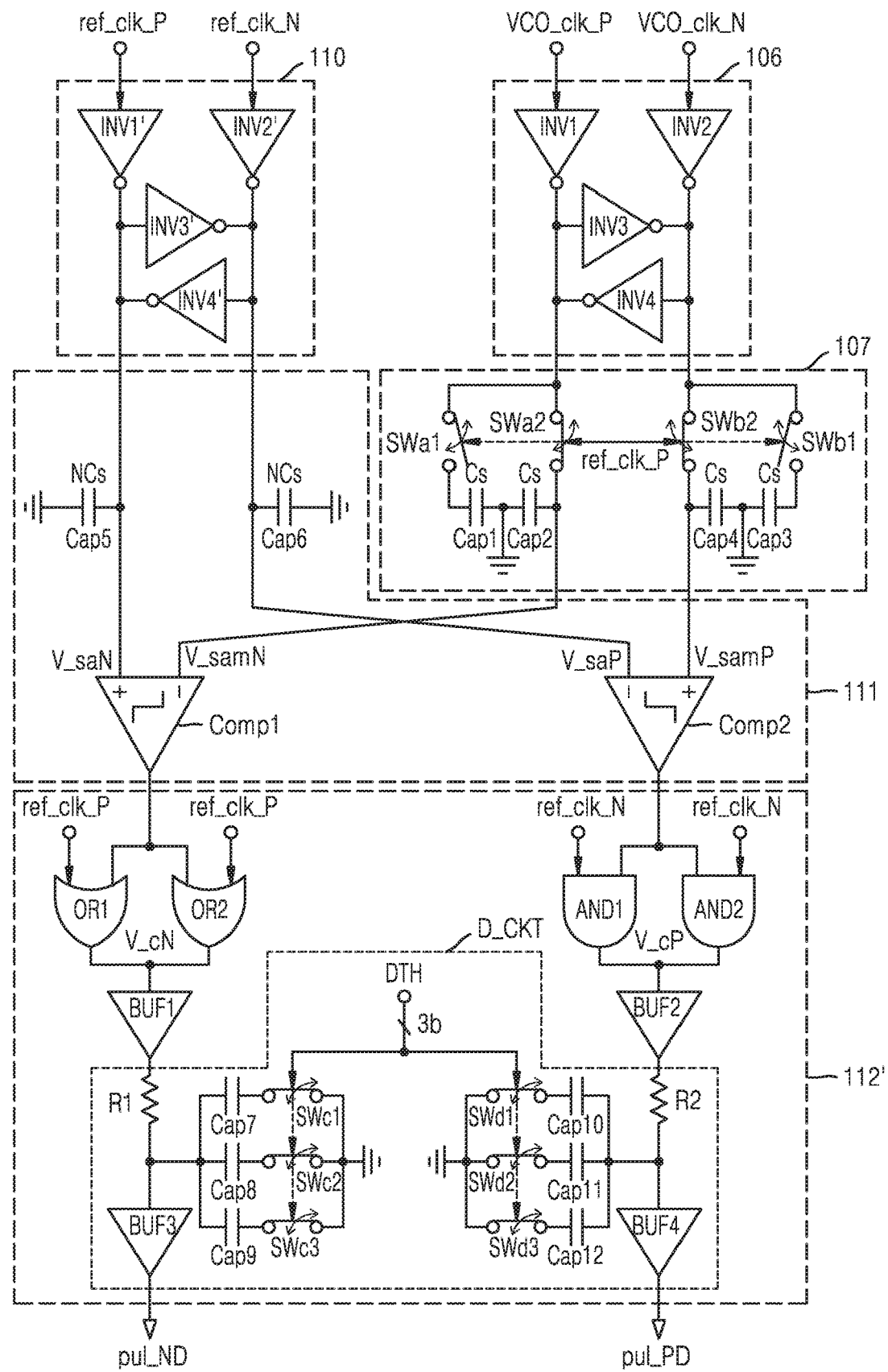
Figure 7:
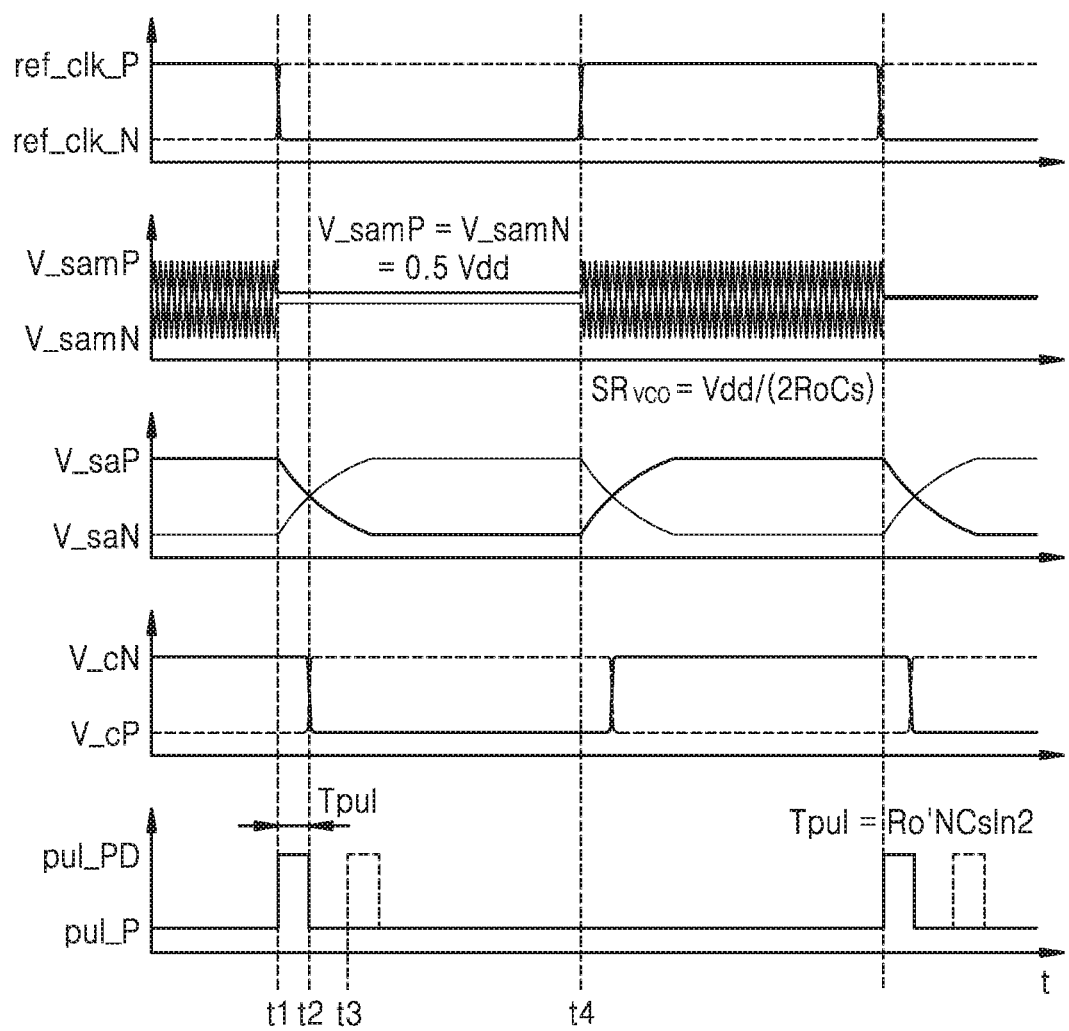
FIG. 7 is a timing diagram for describing an operation of the sub-sampling PLL circuit of FIGS. 6A and 6B.

FIGS. 6A and 6B are circuit diagrams for describing in detail components included in a sub-sampling PLL circuit according to embodiments, and FIG. 7 is a timing diagram for describing an operation of the sub-sampling PLL circuit of FIGS. 6A and 6B.

Referring to FIG. 6A, a sub-sampling PLL may include the buffer circuit 107, the sampler 108, the replica buffer circuit 110, the characteristic detector 111, and the pulse generator 112. The buffer circuit 107 may include a plurality of inverters INV1 to INV4. The sampler 108 may include a plurality of sampling capacitors Cap1 to Cap4 and a plurality of switch elements SWa1, SWa2, SWb1, and SWb2. Sampling capacitors Cap1 to Cap4 may each have a sampling capacitance Cs. The replica buffer circuit 110 may include a plurality of inverters INV1' to INV4'. As mentioned above, the replica buffer circuit 110 may have a circuit configuration that duplicates the buffer circuit 107 and may have characteristic (e.g., a slew rate) same as or similar to the characteristic of the buffer circuit 107. The characteristic detector 111 may include a plurality of capacitors Cap5 and Cap6 and comparers Comp1 and Comp2. The capacitors Cap5 and Cap6 may each have a capacitance NCs equal to N times the sampling capacitance Cs of the sampling capacitors Cap1 to Cap4 (here, N is a real number equal to or greater than 1). The capacitance NCs of the capacitors Cap5 and Cap6 may be determined based on the loop bandwidth of the sub-sampling PLL. Detailed description thereof will be given below. The pulse generator 112 may include a plurality of OR gates OR1 and OR2, a plurality of AND gates AND1 and AND2, and a plurality of buffers BUF1 and BUF2.

The replica buffer circuit 110 may buffer reference clocks ref_clk_P and ref_clk_N through the inverters INV1' to INV4'. Comparative voltage signals V_saP and V_saN may be generated from the reference clocks ref_clk_P and ref_clk_N through the capacitors Cap5 and Cap6 and provided to the comparers Comp1 and Comp2. The buffer circuit 107 may buffer output clocks VCO_clk_P and VCO_clk_N through the inverters INV1 to INV4. The sampler 108 may generate sampling voltage signals V_samP and V_samN by performing a sampling operation based on a positive reference clock ref_clk_P by using the sampling capacitors Cap1 to Cap4 and the switch elements SWa1, SWa2, SWb1, and SWb2 and provide the sampling voltage signals V_samP and V_samN to the comparers Comp1 and Comp2. A first comparer Comp1 may receive a negative sampling voltage signal V_samN and a negative comparative voltage signal V_saN, compare them, and generate a first comparison result signal. A second comparer Comp2 may receive a positive sampling voltage signal V_samP and a positive comparative voltage signal V_saP, compare them, and generate a second comparison result signal.

A first OR gate OR1 and a second OR gate OR2 of the pulse generator 112 may each receive the first comparison result signal and the positive reference clock ref_clk_P, perform an OR operation, and provide a first operation result V_cN to a first buffer BUF1. The first buffer BUF1 may amplify the first operation result V_cN and generate a negative pulse signal pul_N. A first AND gate AND1 and a second AND gate AND2 of the pulse generator 112 may each receive the second comparison result signal and the negative reference clock ref_clk_N, perform an AND operation, and provide a second operation result V_cP to a second buffer BUF2. The second buffer BUF2 may amplify the second operation result V_cP and generate a positive pulse signal pul_P.

FIG. 7 for describing the operation of the sub-sampling PLL of FIG. 6A shows changes of levels of output clocks ref_clk_P and ref_clk_N, sampling voltage signals V_samP and V_samN, comparative voltage signals V_saP and V_saN, comparison result voltage signals V_cN and V_cP, and pulse signals pul_P and pul_N according to the lapse of time during a phase-locking operation using the sub-sampling PL. Hereinafter, descriptions will be given based on positive signals from among differential signals. Because negative signals may be sufficiently inferred through descriptions based on positive signals, detailed descriptions thereof will be omitted.

Further referring to FIG. 7, first, the positive sampling voltage signal V_samP that passes through the buffer circuit 107 and is output from the sampler 108 may be expressed as in Equation 2 below.

$$V\_samP(t) = Vdd(1 - e^{-t/(Ro*Cs)}) \quad \text{[Equation 2]}$$

The positive sampling voltage signal V_samP may be defined with a power voltage Vdd, an output impedance Ro of the buffer circuit 107, and the sampling capacitance Cs. Here, a slew rate $SR_{VCO}$ of the positive sampling voltage signal V_samP due to the buffer circuit 107 may be expressed as in Equation 3 below.

$$SR_{VCO}(t) = \frac{dV\_samP(t)}{dt} = \frac{Vdd}{Ro*Cs} * e^{-t/(Ro*Cs)} \quad \text{[Equation 3]}$$

The slew rate $SR_{VCO}$ is related to the output impedance Ro of the buffer circuit 107, and the output impedance Ro of the buffer circuit 107 is a factor that may vary according to a PVT change. Therefore, a change in the output impedance Ro may cause a change in the slew rate $SR_{VCO}$. To compensate for the change of the slew rate $SR_{VCO}$, the change of the slew rate $SR_{VCO}$ according to a PVT change may be detected by using the replica buffer circuit 110 and the characteristic detector 111, and the pulse width of the positive pulse signal pul_P generated by the pulse generator 112 may be adjusted.

To describe an operation for compensating for a change in the slew rate $SR_{VCO}$, the positive comparative voltage signal V_saP generated by the replica buffer circuit 110 and a capacitor Cap6 may be expressed as in Equation 4 below.

$$V\_saP(t) = Vdd(1 - e^{-t/(Ro'*NCs)}) \quad \text{[Equation 4]}$$

The positive sampling voltage signal V_samP may be defined with the power voltage Vdd, an output impedance Ro' of the replica buffer circuit 110, and the capacitance NCs of the capacitor Cap6. The second comparer ComP2 may detect a rising and falling slew rate of the positive comparative voltage signal V_saP based on the positive sampling voltage signal V_samP, generate a negative comparison result voltage signal V_cN, and provide the negative comparison result voltage signal V_cN to the pulse generator 112. The pulse generator 112 may generate the positive pulse signal pul_P having the pulse width $T_{pul}$ adjusted to maintain a constant loop bandwidth even with a PVT changes and a pulse period $T_{ref}$.

According to embodiments, when a sub-sampling PLL (or a clock generator) enters a lock state (e.g., a state during an interval from 't1' to 't4'), the positive sampling voltage signal V_samP may converge to a value based on the power voltage Vdd at which the buffer circuit 107 operates. For example, the positive sampling voltage signal V_samP may converge to half the value of the power voltage Vdd (0.5 Vdd). In the lock state, Equations 2, 3, and 4 may be simplified to Equations 5, 6, and 7 as follows. Hereinafter, 'ts' denotes a time parameter in the lock state.

$$0.5 * Vdd = \quad\quad [\text{Equation 5}]$$
$$V\_samP(ts) = Vdd(1 - e^{-ts/(Ro*Cs)}) \therefore 0.5 = e^{-ts/(Ro*Cs)}$$

$$SR_{VCO}(ts) = \quad\quad [\text{Equation 6}]$$
$$\frac{dV\_samP(ts)}{dt} = \frac{Vdd}{Ro*Cs} * e^{-ts/(Ro*Cs)} = \frac{Vdd}{2*Ro*Cs}$$

$$0.5 * Vdd = \quad\quad [\text{Equation 7}]$$
$$V\_saP(ts) = Vdd(1 - e^{-ts/(Ro'*NCs)}) \therefore T_{pul} = Ro' * NCs * ln2$$

As described above, the positive pulse signal pul_P generated by the pulse generator 112 may have the pulse width $T_{pul}$ as shown in Equation 7 (e.g., a pulse width corresponding to the length between 't1' and 't2'). In other words, the positive pulse signal pul_P may have the pulse width $T_{pul}$ that may vary according to the output impedance Ro' of the replica buffer circuit 110 that varies with a PVT change.

When performing a sub-sampling based phase-locking operation based on the pulse signal pul_P adaptively adjusted according to a PVT change as described above, the loop bandwidth may be expressed as in Equation 8.

$$\text{Loop Bandwidth} = \quad\quad [\text{Equation 8}]$$
$$C * \frac{Vdd}{2*Ro*Cs} * \left(\frac{Ro'*NCs*ln2}{T_{ref}}\right) * Gm * Z_{LF}(s) * K_{VCO} =$$
$$C * 0.5 * Vdd * N * ln2 * F_{ref} * Gm * Z_{LF}(s) * K_{VCO} \; \because$$
$$R \doteq Ro', F_{ref} = \frac{1}{T_{ref}}$$

As shown in Equation 8, all parameters defining the loop bandwidth may be maintained constant regardless of a PVT change, and thus a constant loop bandwidth may be maintained even with a PVT change.

Further referring to FIG. 6B, a pulse generator 112' may further include a dithering circuit D_CKT. The dithering circuit D_CKT may include a plurality of switch elements SWc1 to SWc3 and SWd1 to SWd3, a plurality of capacitors Cap7 to Cap12, a plurality of resistors R1 and R2, and a plurality of buffers BUF3 and BUF4. The switch elements SWc1 to SWc3 and SWd1 to SWd3 of the dithering circuit D_CKT perform switching operations based on a dithering signal DTH, thereby delaying pulse signals pul_P and pul_N by a timing (e.g., a timing between 't3' and 't1'). As shown in FIG. 7, by using the dithering circuit D_CKT, the pulse generator 112' does not immediately output the pulse signal pul_P at 't1' at which the pulse generator 112' just entered the lock state and outputs a pulse signal pul_PD at 't3' at which the lock state is stably maintained. Therefore, a phase-locking operation may be performed more stably. The dithering circuit D_CKT shown in FIG. 6B is an example, and the embodiments are not limited thereto. The dithering circuit D_CKT may be implemented in various forms according to timing delays.

Furthermore, the configurations of the sub-sampling PLL shown in FIGS. 6A and 6B are examples, and the embodiments are not limited thereto. Various circuit configurations capable of detecting changes in the characteristic of the buffer circuit 107 according to a PVT change and maintaining a loop bandwidth constant by adjusting the pulse widths of the pulse signals pul_P and pul_N based on a detection result may be employed.

Figure 8:
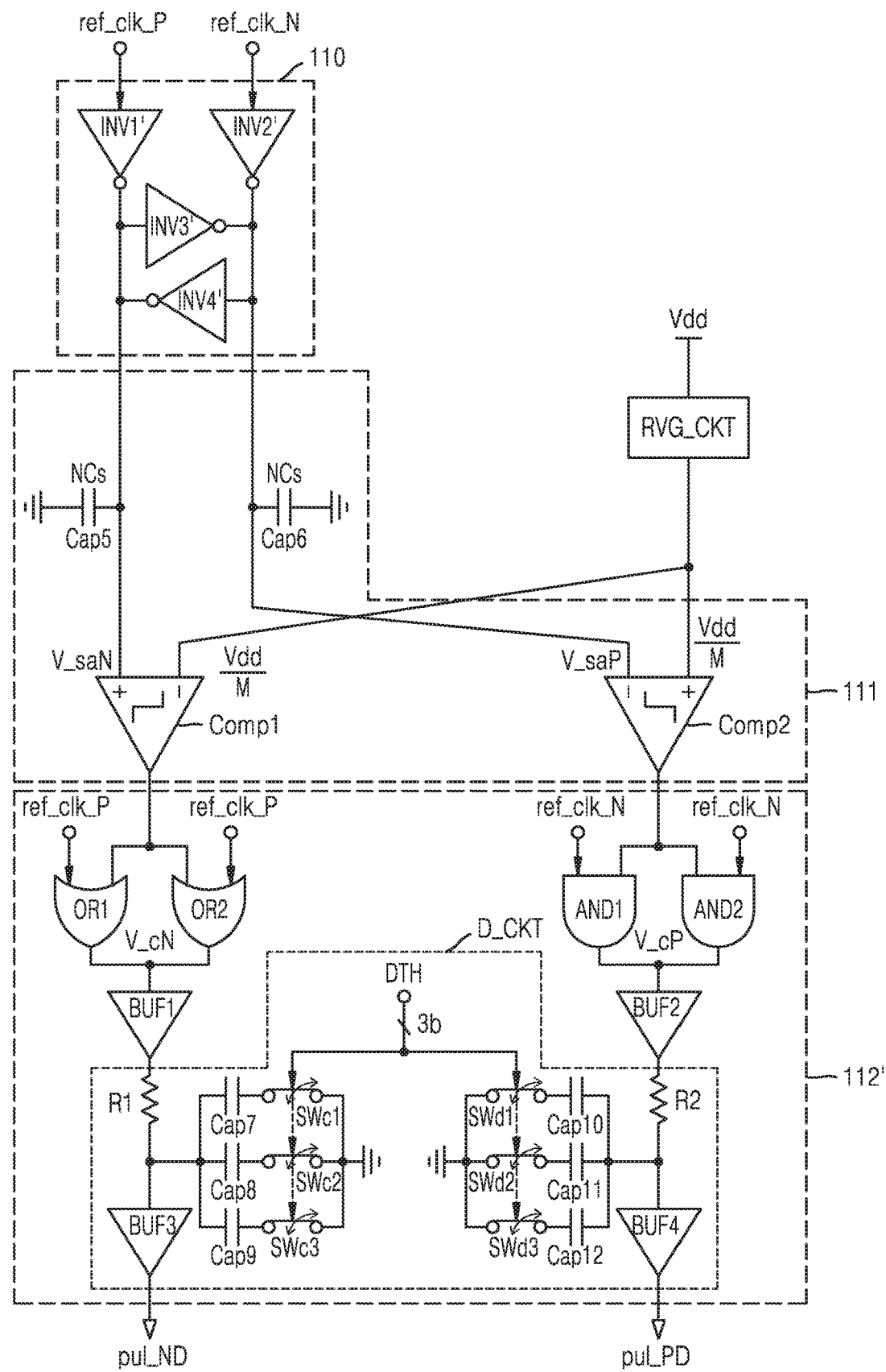
FIG. 8 is a circuit diagram for describing in detail another example of components included in a sub-sampling PLL circuit according to embodiments.

FIG. 8 is a circuit diagram for describing in detail another example of components included in a sub-sampling PLL circuit according to embodiments. Descriptions below will focus on differences from the sub-sampling PLL shown in FIG. 6A.

Referring to FIG. 8, as compared to FIG. 6A, a sub-sampling PLL may further include a reference voltage generating circuit RVG_CKT connected to the power voltage Vdd, and the reference voltage generating circuit RVG_CKT may provide a dropped voltage signal Vdd/M (here, M is a real number equal to or greater than 1) (e.g., M may be 2 to comply with the embodiments shown in FIG. 7) generated by dropping the level of the power voltage Vdd by a level to each of the comparers Comp1 and Comp2. The comparers Comp1 and Comp2 may compare the dropped voltage signal Vdd/M with the comparative voltage signals V_saP and V_saN and output comparison result signals.

However, it is an example, and the sub-sampling PLL may employ various circuit configurations capable of providing a reference voltage signal to the comparators Comp1 and Comp2.

Figure 9:
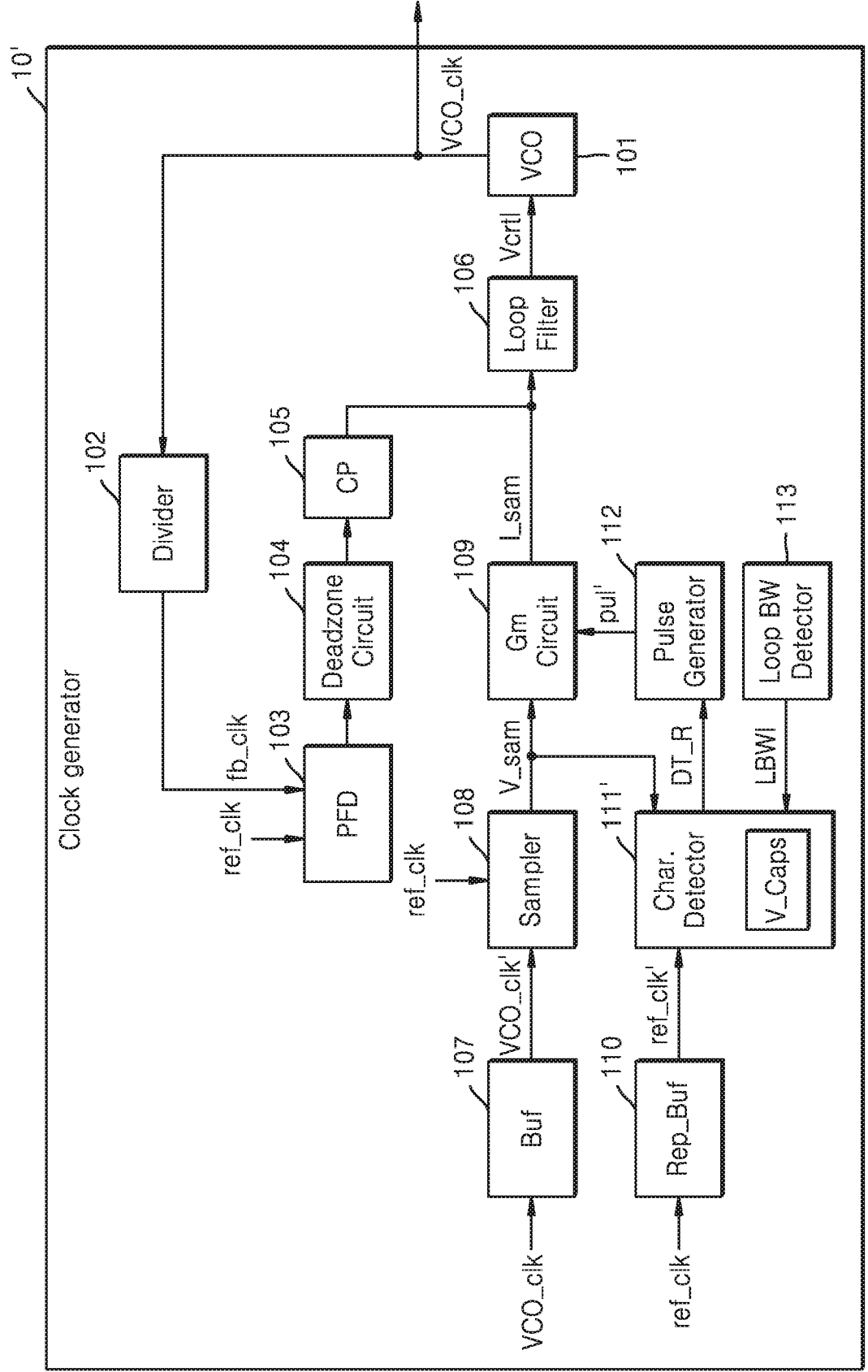
FIG. 9 is a block diagram showing another example of a clock generator according to embodiments.

FIG. 9 is a block diagram showing another example of a clock generator according to embodiments. Descriptions below will focus on components different from those of the clock generator 10 of FIG. 5A.

Referring to FIG. 9, a clock generator 10' may further include a loop bandwidth (BW) detector 113 as compared to the clock generator 10 of FIG. 5A. Furthermore, a characteristic detector 111' may include a plurality of variable capacitors V_Caps. To help understanding, further referring to FIG. 6A, the capacitors Cap5 and Cap6 of the characteristic detector 111 of FIG. 6A may be replaced with the variable capacitors V_Caps in the characteristic detector 111'. The variable capacitors V_Caps may have capacitances 'NCs', and 'N' may correspond to a variable value. The optimal loop bandwidth may vary depending on the noise characteristic of the clock generator 10' (or a sub-sampling PLL), and the loop bandwidth detector 113 may detect a varying optimal loop bandwidth, generate loop bandwidth information LBWI, and provide the loop bandwidth information LBWI to the characteristic detector 111'. The noise characteristic of the clock generator 10' may vary due to various factors including the degradation of the VCO 101. The capacitances of the variable capacitors V_Caps of the characteristic detector 111' may be adjusted based on the loop bandwidth information LBWI. To help understanding, referring to Equation 8, 'N' that defines the loop bandwidth may be adjusted according to a changed loop bandwidth.

The characteristic detector 111' may generate a detection result DT_R' by using the variable capacitors V_Caps and provide the detection result DT_R' to the pulse generator 112. The pulse generator 112 may generate a pulse signal pul' and provide the pulse signal pul' to the transconductance circuit 109 to maintain a constant optimal loop bandwidth. However, the configuration shown in FIG. 9 is an example, and the embodiments are not limited thereto. Various configurations capable of tracking a varying loop bandwidth may be applied to the clock generator 10'.

Figure 10:
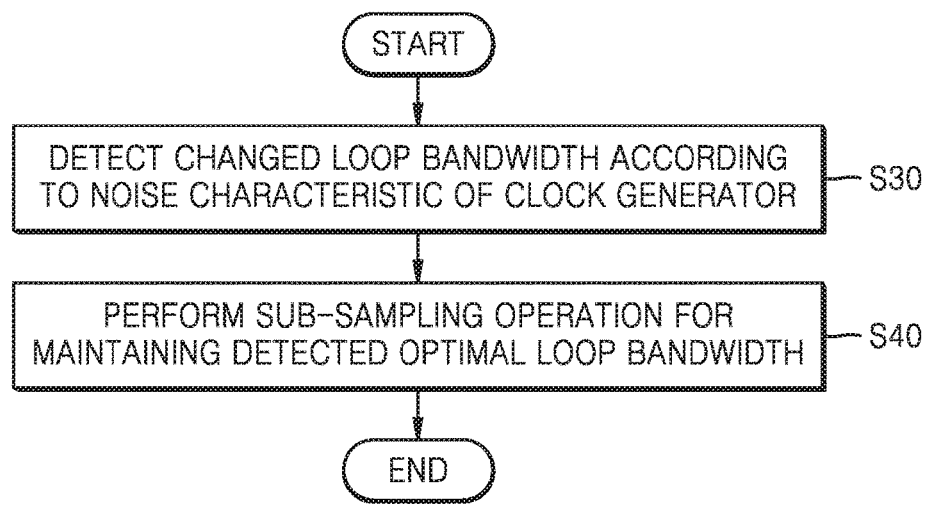
FIG. 10 is a flowchart for describing another example of a phase-locking operation according to embodiments.

FIG. 10 is a flowchart for describing another example of a phase-locking operation according to embodiments. Hereinafter, descriptions of FIG. 10 will be given with reference to FIG. 9.

Referring to FIGS. 9 and 10, the loop bandwidth detector 113 may be used to detect a changed loop bandwidth according to the noise characteristic of the clock generator 10' (operation S30). For example, the noise characteristic of the clock generator 10' may vary due to factors including the degradation of a VCO included in the clock generator 10'. The loop bandwidth detector 113 may monitor a change in the noise characteristic of the clock generator 10' and determine the optimal loop bandwidth from the stored data based on a monitoring result. The loop bandwidth detector 113 may generate the loop bandwidth information LBWI indicating a determined optimal loop bandwidth. However, it is an example, and the embodiments are not limited thereto. Various embodiments may be applied to the loop bandwidth detector 113. For example, the loop bandwidth detector 113 may learn optimal loop bandwidths according to the noise characteristic of the clock generator 10' through machine learning and detect an optimal loop bandwidth based on a learned model.

A sub-sampling operation for maintaining the optimal loop bandwidth detected by using the characteristic detector 111' and the pulse generator 112 may be performed (operation S40). The capacitances of the variable capacitors V_Caps of the characteristic detector 111' may be changed based on the loop bandwidth information LBWI. For example, the capacitance of the variable capacitors V_Caps may be increased when the detected optimal loop bandwidth is increased than before and may be decreased when the detected optimal loop bandwidth is decreased than before. The characteristic detector 111' may generate a detection result DT_R' by using the variable capacitors V_Caps having changed capacitances and provide the detection result DT_R' to the pulse generator 112. The pulse generator 112 may generate a pulse signal pul' whose pulse width is adjusted based on the detection result DT_R' and provide the pulse signal pul' to the transconductance circuit 109, thereby performing a phase-locking operation while maintaining the detected optimal loop bandwidth constant.

Figure 11:
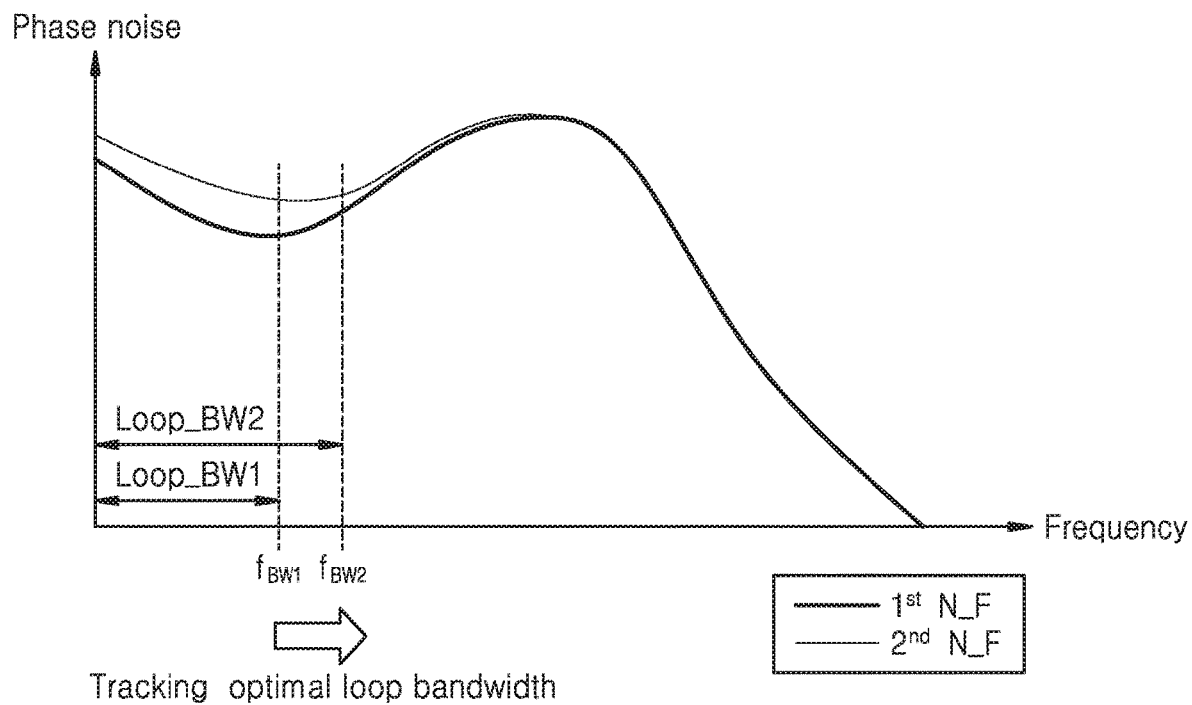
FIG. 11 is a graph for describing an optimal loop bandwidth tracking operation of a clock generator according to embodiments.

FIG. 11 is a graph for describing an optimal loop bandwidth tracking operation of a clock generator according to embodiments.

Referring to FIG. 11, a noise graph may vary according to the noise characteristic of a clock generator, and thus the optimal loop bandwidth may vary. For example, the noise characteristic of a clock generator may vary according to various environments including the degradation of a VCO of the clock generator. The optimal loop bandwidth corresponding to a first noise characteristic 1st N_F may be a first loop bandwidth Loop_BW1, whereas the optimal loop bandwidth corresponding to a second noise characteristic 2nd N_F may be a second loop bandwidth Loop_BW2. In other words, when the noise characteristic of a clock generator is changed from a first noise characteristic 1st N_F to a second noise characteristic 2nd N_F, a change corresponding to a difference between a first frequency $f_{BW1}$ and a second frequency $f_{BW2}$ may occur in the optimal loop bandwidth.

A clock generator may track the optimal loop bandwidth changed as described above and may also perform a phase-locking operation on an output clock while maintaining the changed optimal loop bandwidth constant even with a PVT change.

Figure 12:
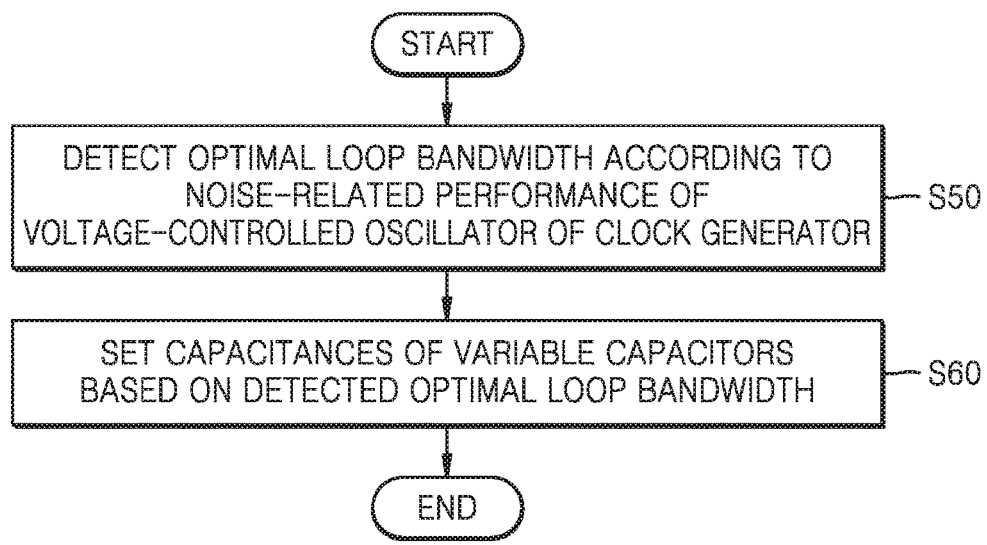
FIG. 12 is a flowchart for describing another example of a phase-locking operation according to embodiments.

FIG. 12 is a flowchart for describing another example of a phase-locking operation according to embodiments. Hereinafter, descriptions of FIG. 12 will be given with reference to FIG. 9.

Referring to FIGS. 9 and 12, the loop bandwidth detector 113 may be used to detect the optimal loop bandwidth according to the noise-related performance of the VCO 101 of the clock generator 10' (operation S50). The loop bandwidth detector 113 may generate the loop bandwidth information LBWI indicating an optimal loop bandwidth. The characteristic detector 111' may set capacitances of variable capacitors based on a detected optimal loop bandwidth (operation S60). In other words, the characteristic detector 111' may set the capacitances of the variable capacitors V_Caps based on the loop bandwidth information LBWI. For example, the larger the detected optimal loop bandwidth is, the larger the capacitance of the variable capacitors V_Caps may be. Also, the smaller the detected optimal loop bandwidth is, the smaller the capacitance of the variable capacitors V_Caps may be. The characteristic detector 111' may generate a detection result DT_R' by using the variable capacitors V_Caps having set capacitances and provide the detection result DT_R' to the pulse generator 112. The pulse generator 112 may generate a pulse signal pul' whose pulse width is adjusted based on the detection result DT_R' and provide the pulse signal pul' to the transconductance circuit 109, thereby performing a phase-locking operation while maintaining the detected optimal loop bandwidth constant.

To summarize, when the clock generator 10' has a configuration for generating a clock signal by selectively using (or including) any one of a plurality of VCOs, the clock generator 10' may set (or adjust) capacitances of the variable capacitors V_Caps to perform a phase-locking operation with an optimal loop bandwidth corresponding with the performance of each of the VCOs with respect to noise.

Figure 13:
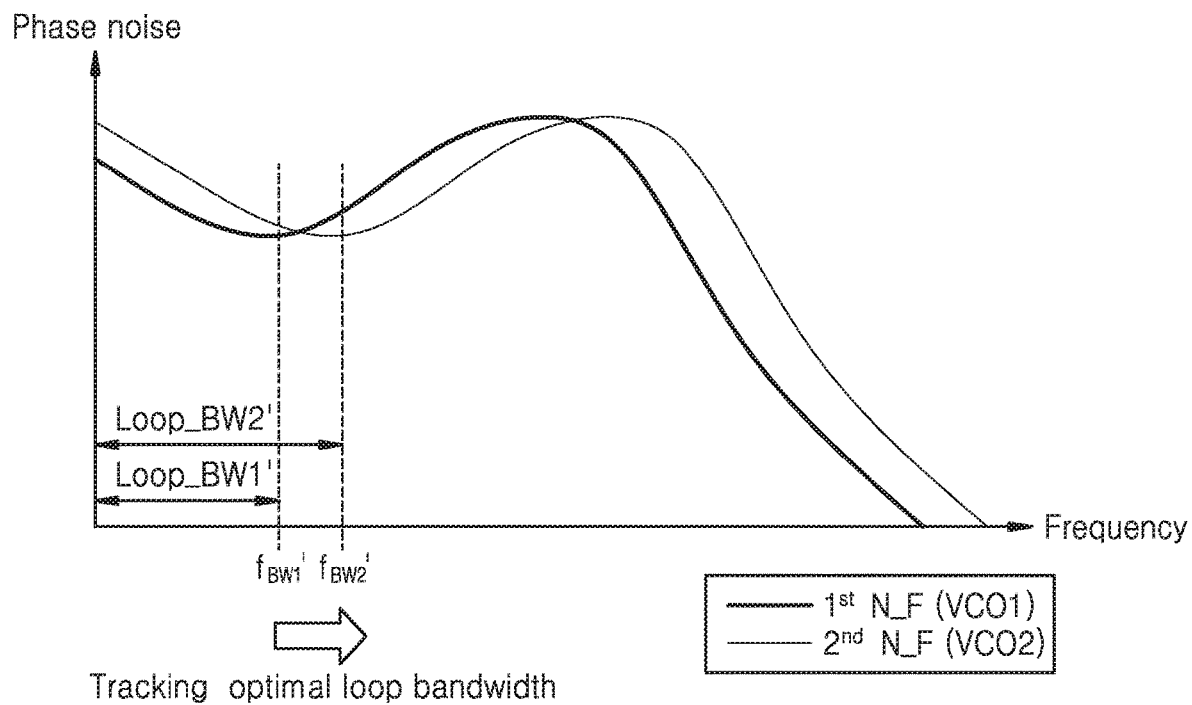
FIG. 13 is a graph for describing another example of an optimal loop bandwidth tracking operation of a clock generator according to embodiments.

FIG. 13 is a graph for describing another example of an optimal loop bandwidth tracking operation of a clock generator according to embodiments.

Referring to FIG. 13, a noise graph may vary according to noise-related performance of VCOs VCO1 and VCO2 (or ring oscillators) included in a clock generator, and thus the optimal loop bandwidth may vary. For example, the clock generator may have the first noise characteristic 1st N_F when the clock generator includes a first voltage-controlled oscillator VCO1 having first noise-related performance, and the optimal loop bandwidth may correspond to a first loop bandwidth Loop_BW1' corresponding to a first frequency $f_{BW1}'$. Also, the clock generator may have the second noise characteristic 2nd N_F when the clock generator includes a second voltage-controlled oscillator VCO2 having second noise-related performance, and the optimal loop bandwidth may correspond to a second loop bandwidth Loop_BW2' corresponding to a second frequency $f_{BW2}'$. The optimal loop bandwidth when performing a phase-locking operation in a clock generator may vary depending on the VCOs VCO1 and VCO2 of the clock generator.

A clock generator may track the optimal loop bandwidth according to the VCOs VCO1 and VCO2 by simply adjusting the capacitances of variable capacitors and perform a phase-locking operation corresponding to the optimal loop bandwidth. Furthermore, a phase-locking operation may be performed on an output clock while maintaining a changed optimal loop bandwidth constant even with a PVT change.

Figure 14:
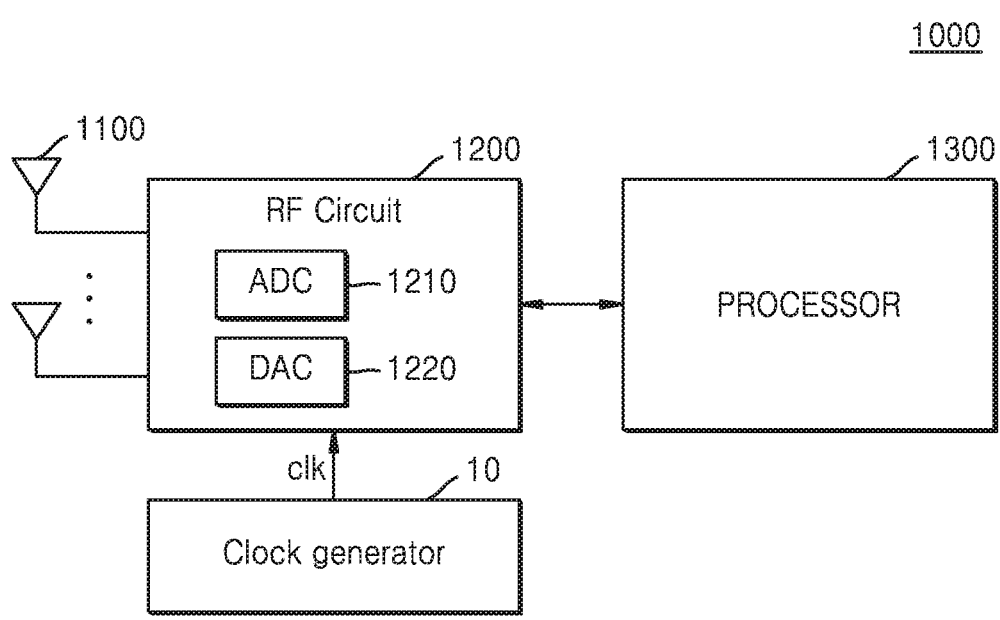
FIG. 14 is a block diagram showing a wireless communication device according to embodiments.

FIG. 14 is a block diagram showing a wireless communication device according to embodiments.

Referring to FIG. 14, a wireless communication device 1000 may include a plurality of antennas 1100, a radio frequency (RF) circuit 1200, a processor 1300, and the clock generator 10. The RF circuit 1200 may include an analog-to-digital converter (ADC) 1210 for converting analog data received through the antennas 1100 into digital data, and a digital-to-analog converter (DAC) 1220 for converting digital data received from the processor 1300 into analog data. The clock generator 10 employs the above-stated embodiments, and may lock the phase of an output clock clk to a constant loop bandwidth even with a PVT change. Furthermore, the clock generator 10 may track the optimal loop bandwidth according to the performance of a VCO of the clock generator 10 regarding noise.

The ADC 1210 and the DAC 1220 may perform conversion operations based on the output clock clk with high reliability from the clock generator 10. As a result, the performance of the wireless communication device 1000 may be improved.

Figure 15:
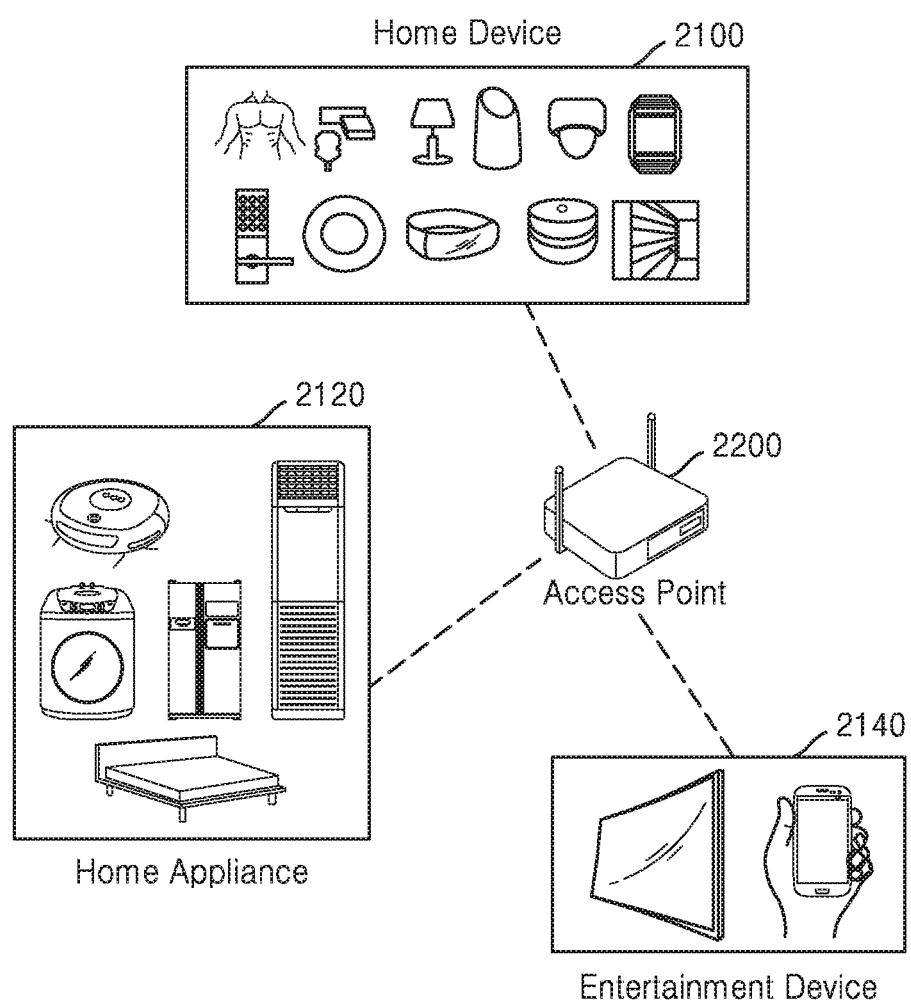
FIG. 15 is a diagram showing communication devices including clock generators for performing a phase-locking operation of a clock, according to embodiments.

FIG. 15 is a diagram showing communication devices including clock generators for performing a phase-locking operation of a clock, according to embodiments.

Referring to FIG. 15, a home device 2100, a household appliance 2120, an entertainment device 2140, and an access point (AP) 2200 may each include a clock generator that performs a phase-locking operation of a clock. In embodiments, the home device 2100, the household appliance 2120, the entertainment device 2140, and the AP 2200 may constitute an Internet of Things (IoT) network system. The communication devices shown in FIG. 15 are examples, and it would be obvious that a wireless communication device may be included in other communication devices not shown in FIG. 15.

As is traditional in the field of the inventive concepts, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

While the inventive concept has been shown and described with reference to the embodiments thereof, it will be understood that various changes in form and details may be made therein without departing from the spirit and scope of the following claims.

What is claimed is:

1. A phase-locked loop (PLL) circuit comprising:
a voltage-controlled oscillator configured to generate an output clock; and
a sub-sampling PLL circuit configured to:
receive, from the voltage-controlled oscillator, the generated output clock as feedback, and
perform a phase-locking operation on the received output clock,
wherein the sub-sampling PLL circuit comprises a buffer configured to buffer the received output clock,
wherein the sub-sampling PLL circuit is further configured to adaptively adjust an internal signal to maintain a loop bandwidth of the sub-sampling PLL circuit, based on a change of a characteristic of the buffer according to at least one of process, voltage, and temperature (PVT) change, and
wherein the characteristic of the buffer is a slew rate of the buffer.

2. The PLL circuit of claim 1, wherein the sub-sampling PLL circuit further comprises a replica buffer corresponding to the buffer, and
wherein the sub-sampling PLL circuit is further configured to:
detect the change of the characteristic of the buffer, using the replica buffer; and
adjust the internal signal, based on the detected change of the characteristic of the buffer.

3. The PLL circuit of claim 1, wherein the sub-sampling PLL circuit is further configured to:
based on the slew rate of the buffer increasing, adjust the internal signal to decrease a loop gain of the sub-sampling PLL circuit; and
based on the slew rate of the buffer decreasing, adjust the internal signal to increase the loop gain of the sub-sampling PLL circuit.

4. The PLL circuit of claim 1, wherein the sub-sampling PLL circuit further comprises:
a replica buffer configured to buffer a reference clock, the replica buffer corresponding to the buffer;
a characteristic detector configured to detect the change of the characteristic of the buffer, based on the buffered reference clock and a sample voltage signal; and
a pulse generator configured to generate the internal signal, based on the detected characteristic of the replica buffer.

5. The PLL circuit of claim 4, wherein the sub-sampling PLL circuit further comprises:
a sampler configured to:
sample the output clock buffered by the buffer, based on the reference clock; and
generate the sample voltage signal, based on the sampled output clock;
a transconductance circuit configured to generate a sample current signal, based on the generated sample voltage signal; and
a charge pump circuit configured to perform a charge pumping operation to generate a voltage control signal that is applied to the voltage-controlled oscillator, based on the adjusted internal signal and the generated sample current signal.

6. The PLL circuit of claim 5, wherein the charge pump circuit is configured to perform the charge pumping operation in a high-level pulse period of the adjusted internal signal.

7. The PLL circuit of claim 4, wherein the sub-sampling PLL circuit further comprises a sampler configured to:

sample the output clock buffered by the buffer, based on the reference clock; and
generate the sample voltage signal, based on the sampled output clock.

8. The PLL circuit of claim 4, wherein the sub-sampling PLL circuit further comprises a reference voltage generating circuit configured to generate a dropped voltage signal as the sample voltage signal, based on a power voltage.

9. The PLL circuit of claim 4, wherein the characteristic detector further comprises:
a capacitor configured to generate a comparative voltage signal reflecting a characteristic of the replica buffer, based on the buffered reference clock; and
a comparison circuit configured to compare the generated comparative voltage signal with the sample voltage signal to generate a detection result signal.

10. The PLL circuit of claim 9, wherein a capacitance of the capacitor is determined based on the loop bandwidth.

11. The PLL circuit of claim 4, wherein the pulse generator further comprises a dithering circuit configured to delay the generated internal signal.

12. A phase-locked loop (PLL) circuit comprising:
a voltage-controlled oscillator configured to generate an output clock; and
a sub-sampling PLL circuit configured to perform a phase-locking operation on the generated output clock,
wherein the sub-sampling PLL circuit comprises:
a buffer configured to buffer the generated output clock; and
a replica buffer that is used to detect a change of a characteristic of the buffer according to at least one of process, voltage, and temperature (PVT) change, and
wherein the sub-sampling PLL circuit is further configured to:
generate a comparative voltage signal reflecting a characteristic of the replica buffer; and
adaptively adjust a pulse width of an internal signal to maintain a loop bandwidth of the sub-sampling PLL circuit, based on the generated comparative voltage signal.

13. The PLL circuit of claim 12, wherein the sub-sampling PLL circuit further comprises a capacitor comprising:
a first end connected to an output of the replica buffer; and
a second end connected to ground, and
wherein the sub-sampling PLL circuit is further configured to generate the comparative voltage signal, based on a reference clock that is buffered by the replica buffer and the capacitor.

14. The PLL circuit of claim 13, wherein the sub-sampling PLL circuit further comprises a sampler configured to:
sample the output clock buffered by the buffer, based on the reference clock; and
generate a sample voltage signal, based on the sampled output clock, and wherein the sub-sampling PLL circuit is further configured to:
compare the generated voltage signal with the generated comparative voltage signal to generate a detection result signal; and
adaptively adjust the pulse width, based on the generated detection result signal.

15. The PLL circuit of claim 12, wherein the sub-sampling PLL circuit further comprises a charge pump circuit configured to perform a charge pumping operation to generate a voltage control signal that is applied to the voltage-controlled oscillator in a high-level period of the internal signal.

16. The PLL circuit of claim 15, wherein the characteristic of the buffer is a slew rate of the buffer.

17. The PLL circuit of claim 16, wherein the sub-sampling PLL circuit is further configured to:
based on the slew rate of the buffer increasing, narrow the pulse width of the internal signal to decrease a loop gain of the sub-sampling PLL circuit; and
based on the slew rate of the buffer decreasing, widen the pulse width of the internal signal to increase the loop gain of the sub-sampling PLL circuit.

18. A clock generator comprising:
a voltage-controlled oscillator configured to generate an output clock;
an assistant phase-locked loop (PLL) circuit configured to perform a primary phase-locking operation on the generated output clock; and
a sub-sampling PLL circuit configured to perform a secondary phase-locking operation on the output clock after the primary phase-locking operation is performed,
wherein the PLL circuit further comprises:
a buffer configured to buffer the generated output clock;
a replica buffer configured to have a characteristic identical to a characteristic of the buffer, and buffer a reference clock;
a characteristic detector configured to detect a change of the characteristic of the buffer according to at least one of process, voltage, and temperature (PVT) change, based on the buffered reference clock; and
a pulse generator configured to generate a pulse signal with a pulse width that is adjusted based on the detected change of the characteristic of the buffer.

19. The PLL circuit of claim 18, wherein the characteristic of the buffer is a slew rate of the buffer, and
wherein the pulse generator is further configured to:
based on the slew rate of the buffer increasing, adjust the pulse width to decrease a loop gain of the sub-sampling PLL circuit; and
based on the slew rate of the buffer decreasing, adjust the pulse width to increase the loop gain.

* * * * *